United States Patent [19]

Ishikawa et al.

[11] Patent Number: 4,816,788

[45] Date of Patent: Mar. 28, 1989

[54] HIGH FREQUENCY BAND-PASS FILTER

[75] Inventors: Youhei Ishikawa, Kyoto; Hiroaki Tanaka, Nagaokakyo, both of Japan

[73] Assignee: Murata Manufacturing Co., Ltd., Japan

[21] Appl. No.: 68,439

[22] Filed: Jun. 30, 1987

[30] Foreign Application Priority Data

Jul. 1, 1986 [JP] Japan ................................ 61-155426
Aug. 27, 1986 [JP] Japan ................................ 61-202398

[51] Int. Cl.[4] ...................... H01P 1/203; H01P 1/205; H03H 11/10

[52] U.S. Cl. .................................... 333/203; 333/202; 333/204; 333/217; 330/53

[58] Field of Search ............... 333/204, 202, 205, 206, 333/207, 217, 219, 235, 222, 223, 203, 246; 330/56, 57, 53, 271, 286; 331/96

[56] References Cited

U.S. PATENT DOCUMENTS 3,457,528 7/1969 Ingerson ................................ 330/56
3,721,918 3/1973 Rosen et al. ........................ 330/56 X
4,012,705 3/1977 Prevot ................................ 333/204 X
4,315,229 2/1982 Greaves et al. ...................... 333/217
4,661,789 4/1987 Rauscher ............................ 333/202

OTHER PUBLICATIONS

Wild et al.,-"HANDBOOK OF TRI-PLATE MICROWAVE COMPONENTS", copyright 1956, Sanders Associates, Nashua, New Hampshire; pp. 89-108 & title page.

*Primary Examiner*—Marvin L. Nussbaum
*Attorney, Agent, or Firm*—Ostrolenk, Faber, Gerb & Soffen

[57] ABSTRACT

A high frequency band-pass filter which includes a single resonator or a plurality of resonators adapted to pass a high frequency signal of a predetermined frequency band region, and an active element device electrically coupled with one or the plurality of the resonators so as to present a negative resistance when the resonator is in a resonant state.

25 Claims, 6 Drawing Sheets

HIGH FREQUENCY BAND-PASS FILTER

BACKGROUND OF THE INVENTION

The present invention generally relates to an electrical filter, and more particularly, to a high frequency band-pass filter of the distributed constant type, to be used particularly as a filter of a transmitting antenna.

Commonly, a transmitter is provided with an antenna filter for suppression of unnecessary frequencies of radiation.

In the block diagram of FIG. 11 showing a general arrangement of a conventional antenna filter as referred to above, an output stage of the transmitter XR has an antenna filter FL connected to it. An antenna AN is coupled to the antenna filter FL as illustrated. For the antenna filter FL, a high frequency band-pass filter of the distributed constant type, employing dielectric coaxial resonators or strip line resonators, may be used. Normally, such a high frequency band-pass filter FL includes a plurality of resonators, e.g. four resonators V, each of which has an electrical length, for example, of $\lambda/2$ as in the arrangement of FIG. 11.

An antenna filter of the distributed constant type, as described above, has an insertion loss. Thus, a case where, for example, a high frequency signal of 5 W is applied to an antenna filter which has an insertion loss of 3 dB, the power delivered to the antenna will be 2.5 W, and it folows that a difference of power of 2.5 W between the input signal power and the antenna power has been consumed in the antenna filter. Thus, the efficiency is very low as observed for the transmitter as a whole.

Particularly, since a filter employing strip line resonators has resonators with low filter sharpness (Q) of the (in the range of approximately several tens to several hundreds in the microwave region), it has a high insertion loss, and if used as an antenna filter, reduces the efficiency of the transmitter as a whole to a great extent.

To overcome the disadvantage, the filter sharpness Q may be increased, to reduce the insertion loss, but generally, in filters employing dielectric coaxial resonators or strip line resonators, the size of the filter configuration and the filter sharpness Q are directly related to each other, and thus, the filter size is undesirably increased, if the filter sharpness Q is to be improved.

Accordingly, in conventional high frequency equipment such as a transmitter and the like, the problem has been that, if it is intended to reduce the loss of power in the antenna filter, the size of the entire filter is increased, while on the contrary, when it is attempted to reduce the overall size of the filter, the power loss in the antenna filter is undesirably increased, thereby presenting a bottleneck in the reduction of size of high frequency equipment.

SUMMARY OF THE INVENTION

Accordingly, an essential object of the present invention is to provide a high frequency band-pass filter in which its filter sharpness Q is increased, in order to reduce the insertion loss, of the filter without increasing the size of the filter.

Another important object of the present invention is to provide a high frequency band-pass filter of the above described type which is compact in size with a sufficient gain, and capable of being matched with external circuits.

The problems in the conventional filter as described earlier are considered to be attributable to the fact that the antenna filter is a passive circuit.

Therefore, in accomplishing these and other objects, according to one preferred embodiment of the present invention, there is provided a high frequency band-pass filter which includes a single resonator or a plurality of resonators adapted to pass a high frequency signal of a predetermined frequency band, and active element means electrically coupled with one or the plurality of the resonators so as to present a negative resistance when the resonator is in a resonant state.

In the above arrangement, since energy is supplied from the active element means to the resonator when the combination of the resonator with the active element means is in the resonant state, the loss n the resonator is cancelled thereby, and thus, the sharpness Q of the filter is raised equivalently.

In another aspect of the present invention, there is provided a high frequency filter which includes a combination of resonator means and active element means, with an outer sharpness Q of the resonator as observed from the input side thereof and an outer sharpness Q of said resonator as observed from the output side thereof being asymmetrically set with respect to each other so as to achieve matching with external circuits while providing gain.

When the sharpness Q at the input side and the sharpness Q at the output side are set to be in the asymmetrical relation as above, it becomes possible to achieve matching with external circuits while providing gain.

By the above arrangement of the present invention, matching can be effected with respect to the external circuits while providing gain in the high frequency band and therefore, a compact high frequency filter having superior matching characteristics with external circuits and also having gain may be advantageously presented.

BRIEF DESCRIPTION OF THE DRAWINGS

These and other objects and features of the present invention will become apparent from the following description of several preferred embodiments thereof with reference to the accompanying drawings, in which.

DETAILED DESCRIPTION OF THE INVENTION

Figure 1:
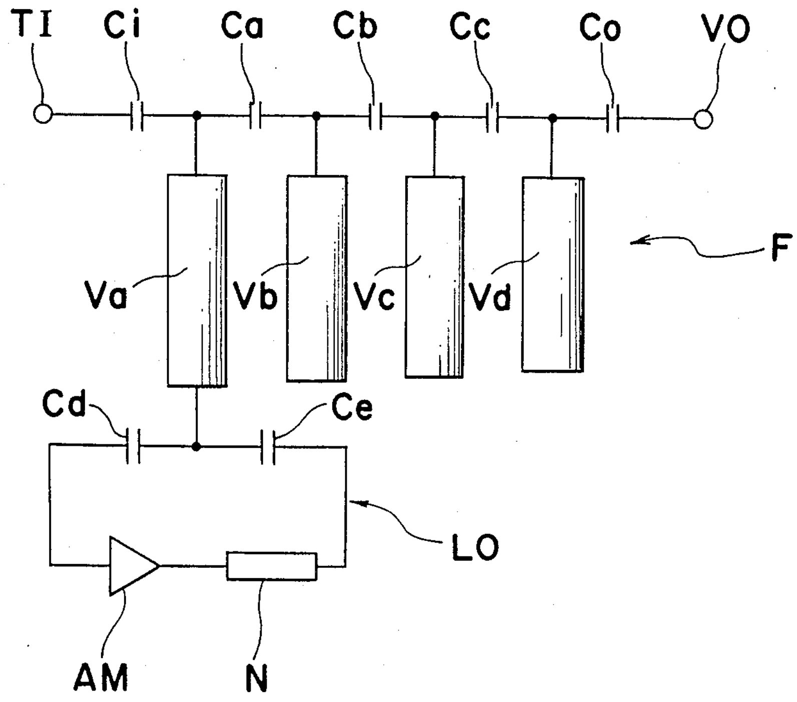
FIG. 1 is a block circuit diagram showing a general construction of a high frequency band-pass filter according to a first embodiment of the present invention.

Before the description of the present invention proceeds, it is to be noted that like parts are designated by like reference numerals throughout the accompanying drawings.

Referring now to the drawings, there is shown in FIG. 1, a block circuit diagram showing a fundamental construction of a high frequency band-pass filter F according to a first embodiment of the present invention.

The high frequency band-pass filter F is a four-stage filter, and includes four resonators Va, Vb, Vc and Vd each having an electrical length of λ/4 and be interconnected by capacitors Ca, Cb and Cc at corresponding first ends thereof. The resonators are coupled to an input terminal TI at the initial stage of the filter (resonator Vd) by a capacitor Ci and to an output terminal TO at the last stage of the filter (resonator Vd) by a capacitor Co. The second with the outer ends of the respective resonators Va to Vd (opposite the first ends) are open. A positive feedback loop LO which embodies an active element device in this embodiment, includes an amplifier AM and is connected to the open end of the resonator Va. The positive feedback loop LO includes the amplifier AM and a phase adjuster N connected in series with each other, which are coupled to the open end of the resonator Va by gap capacities Cd and Ce respectively.

In the high frequency band-pass filter F of the above described type, the amplifier AM shows a negative resistance when the resonator Va at the input side initial stage is brought into a resonant state, whereby energy is supplied from the amplifier AM to the resonator Va, and consequently, the power loss at the resonator Va is cancelled, with the sharpness Q being improved equivalently.

Moreover, the increase of the sharpness Q as described above takes place not only in the resonator Va at the input side initial stage which is coupled with the positive feedback loop LO, but also in all of the resonators Vb to Vd, which are coupled to resonator Va. Therefore, the power loss is advantageously reduced with respect to each of the resonators Va to Vd.

Although electric power must be fed to the amplifier AM, the amount of electric power to be supplied to the amplifier AM is small as compared with the reduction of transmitter power consumption at the filter F, and therefore, the overall power consumption as observed for the entire transmitter combined with this filter F is reduced.

Furthermore, when the amplifier AM is combined with the resonator Va at the input side initial stage closest to the transmitter as shown in the above embodiment, the resonators Vb to Vd after the initial stage function as a noise eliminating filter with respect to the noise generated at the amplifier AM, and thus, no influence by the noise of the amplifier AM is noticed externally.

It should be noted here that the resonators constituting the filter may be dielectric coaxial resonators or strip line resonators, and can be provided either in a single stage or a plurality of stages.

Figure 2:
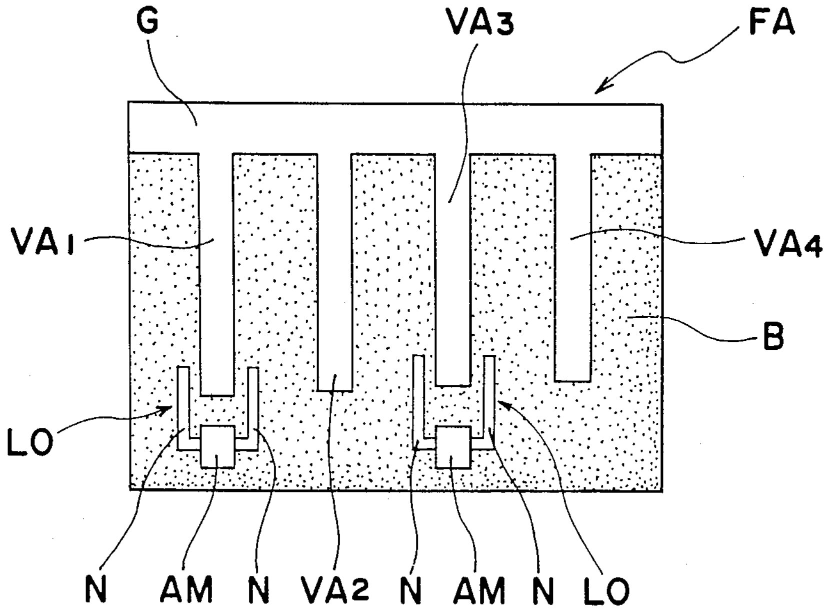
FIG. 2 is a top plan view showing a first modification of the filter of FIG. 1 as applied to a four stage combline type strip line resonator.

Referring to FIG. 2, there is shown a modification of the filter of FIG. 1 according to the present invention which comprises comb-line type strip line resonators in four stages.

The strip line band-pass filter FA of FIG. 2 includes a dielectric base or substrate B, and strip line resonators VA1, VA2, VA3 and VA4 in four stages, each having an electrical length of λ/4 and being provided on a first main surface of substrate B, and being connected at one end to a ground electrode G and open at the other end. Another ground electrode (not shown) is provided all over the other (second) main surface of the substrate B and is connected to said ground electrode G on the first main surface across one end face of said substrate B. An amplifier AM and phase adjusting strip lines N are each connected through a respective gap capacity to the open end of each of the resonators VA1 and VA3, which are respectively at the input side initial stage and the third stage, so as to form positive feedback loops LD.

It is to be noted here that in the case where the strip line resonators are provided in a plurality of stages as in the above embodiment, the number of stages of the strip line resonators to be provided with the positive feedback loops is not limited to two as in FIG. 2, but may be decreased or increased depending on necessity.

Figure 3:
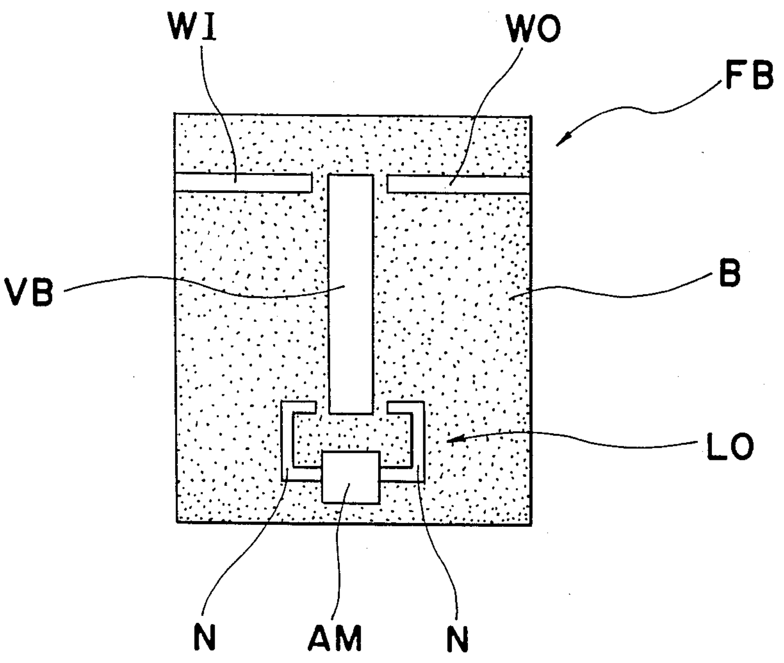
FIG. 3 is a top plan view showing a second modification of the filter of FIG. 1 as applied to a single stage $\lambda/2$ strip line resonator.

In FIG. 3, there is shown another modification of the filter according to the present invention which comprises a λ/2 strip line resonator in one stage.

This strip line band-pass filter FB of FIG. 3 includes a dielectric substrate B, a λ/2 strip line resonator VB, and an input strip line WI and an output strip line WO which are formed on one main surface of the substrate B. The input strip line WI and output strip line WO are each coupled by a respective gap capacity, to one end of said strip line resonator VB, and an amplifier AM and phase adjusting strip lines N are coupled to the other open end of the resonator VB by a gap capacity so as to form a positive feedback loop LO.

Figure 4:
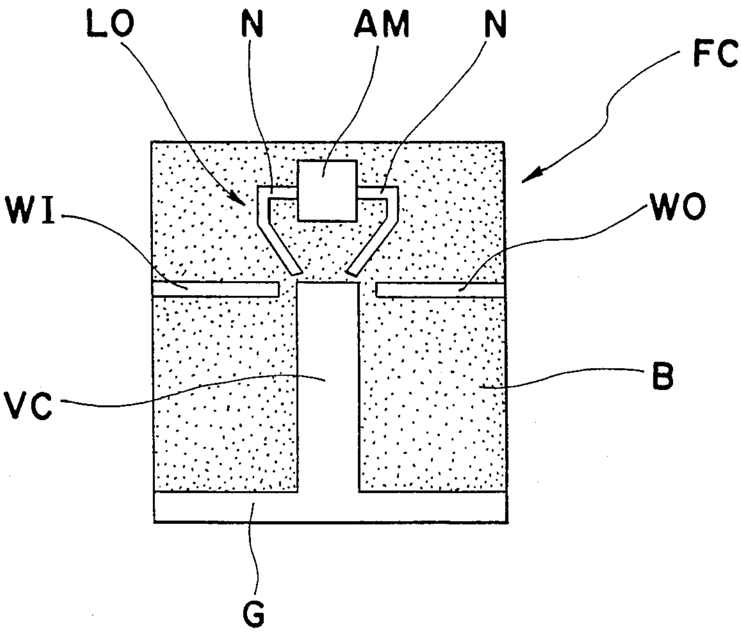
FIG. 4 is a top plan view showing a third modification of the filter of FIG. 1 as applied to a single stage $\lambda/4$ strip line resonator.

Referring further to FIG. 4, there is shown a further modification of the filter of FIG. 1 according to the present invention comprising a λ/4 strip line resonator of a single stage.

The strip line band-pass filter FC of FIG. 4 includes a dielectric substrate B, and a strip line resonator VC formed on a first main surface of said substrate B and short-circuited at its first end to a ground electrode G, with the other (second) end thereof being open. An input strip line WI and an output strip line WO are coupled by gap capacity, to the second end of the strip line resonator VC, and an amplifier AM and phase adjusting strip lines N are also coupled to said second end of said strip line resonator VC by a gap capacity so as to form a positive feedback loop LO.

It should be noted here that, in the foregoing embodiments, although the positive feedback loop of the amplifier is combined with the resonator by capacitive coupling, such positive feedback loop may also be combined with the resonator by inductive coupling to obtain similar effects as with capacitive coupling.

Figure 5:
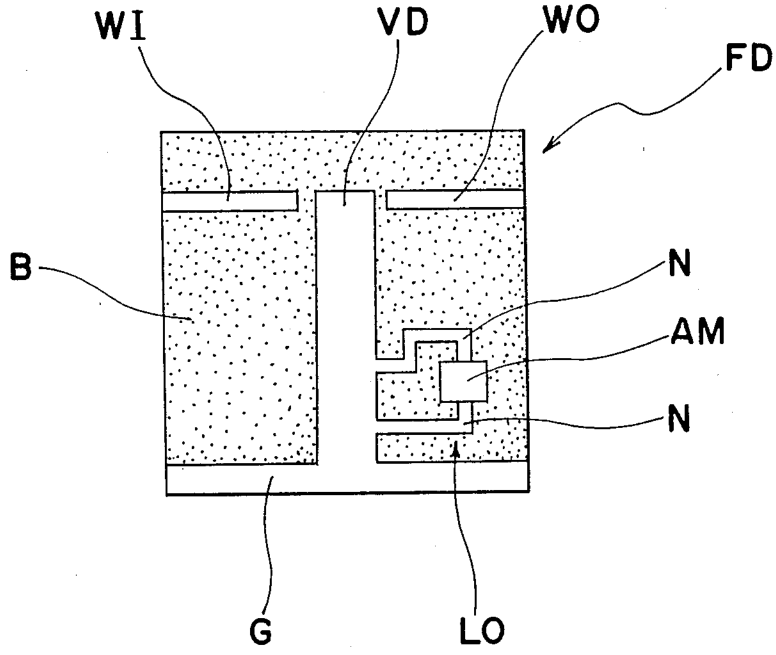
FIG. 5 is a top plan view showing a fourth modification of the filter of FIG. 1 as applied to a single stage $\lambda/4$ strip line resonator to which an amplifier is inductively coupled.

Referring now to FIG. 5, there is shown a still further modification of the filter of FIG. 1 of the present invention, which comprises a λ/4 strip line resonator in which an amplifier is coupled to the resonator by inductance.

The strip line band-pass filter FD of FIG. 5 includes a dielectric substrate B, a λ/4 strip line resonator VD formed on a first main surface of said substrate B, which is short-circuited at its first end to a ground electrode G, with the other (second) end thereof being open. An input strip line WI and an output strip line WO are coupled by capacity, to the second end of the strip line resonator VD. An amplifier AM and phase adjusting strip lines N are coupled adjacent to said short-circuited end of said strip line resonator VD by induction coupling so as to form a positive feedback loop LO.

It is to be noted here that in the foregoing embodiments, although the present invention has been described only with respect to the case where the band-pass filter is applied as a transmitting antenna filter, the band-pass filter according to the present invention may also be used as a receiving filter as well.

As is clear from the foregoing description, according to the high frequency band-pass filter of the present invention, since energy is supplied from the active device means to the resonator, when the resonator combined with the active device means is in the resonant state, the loss of the resonator is cancelled thereby. As a result, the sharpness Q of the filter can be raised equivalently, and when the filter of the present invention is connected to the output stage of a transmitter as an antenna filter, it becomes possible to reduce the power consumption of the transmitter to a large extent.

The space required for providing the active element means may be comparatively small, and the space originally existing in the filter may be utilized for the purpose, and thus, no increase in the size of the filter will be required. Accordingly, the over all size of the filter is not increased, but reduction in the power consumption is obtained, whereby the above-mentioned problems of the prior art are solved by the invention.

Figure 6:
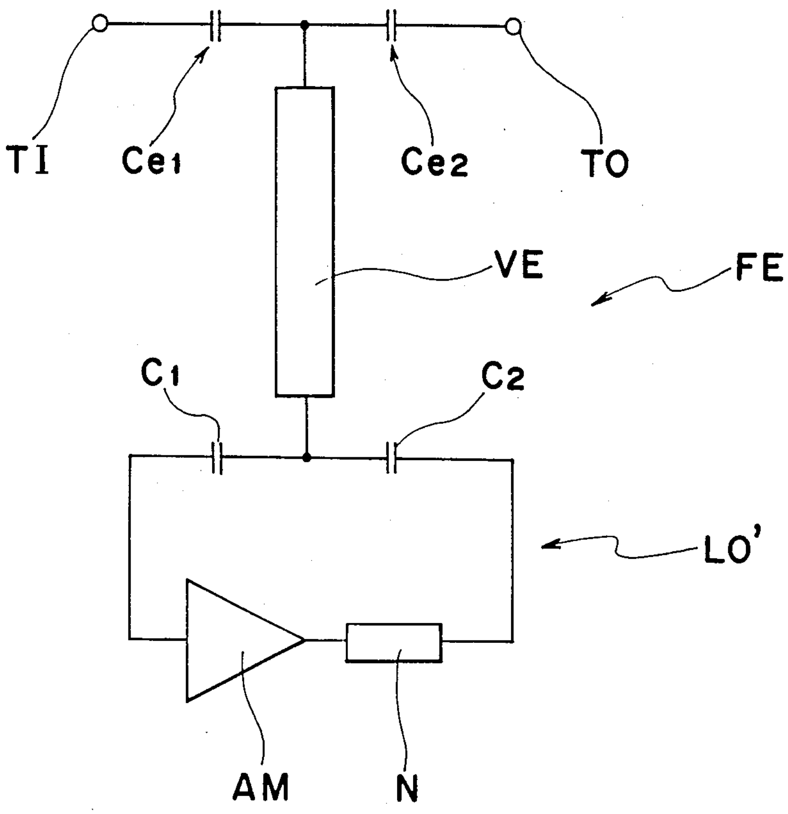
FIG. 6 is a block circuit diagram showing a general construction of a high frequency filter according to a second embodiment of the present invention.

Referring now to FIG. 6, there is shown a general construction of a high frequency filter according to a second embodiment of the present invention.

The high frequency filter FE in FIG. 6 is a high frequency band-pass filter, and includes a resonator VE having an electrical length of λ/4. The resonator VE has its first end connected to the input terminal TI through a static capacity Ce1, and also connected to the output terminal TO through a static capacity Ce2. The second end (open end) of the resonator VE is coupled to a positive feedback loop LO′ including an amplifier AM as an active element means the feedback loop LO′ being similar to the positive feedback loop LO in FIG. 1. This positive feedback loop LO′ includes the amplifier AM and a phase adjuster N connected in series with each other, and coupled to the open end of the resonator VE through gap capacities C1 and C2.

In the high frequency filter FE in FIG. 6, in order to allow matching with respect to external circuits while providing gain, the outer sharpness Qe1 of the resonator VE as observed from the side of the input terminal TI and the outer sharpness Qe2 of the resonator VE as observed from the side of the output terminal TO are arranged to be asymmetrical with respect to each other. More specifically, they are set in the relation Ce1≠Ce2. Favorable results have been obtained preferably in the relation of Ce1<Ce2, and more preferably when Ce1 is set to be less than ½ of Ce2.

By the above arrangement, the high frequency filter FE of FIG. 6 may be properly matched with external circuits while having gain in the manner as described hereinbelow.

Figure 7:
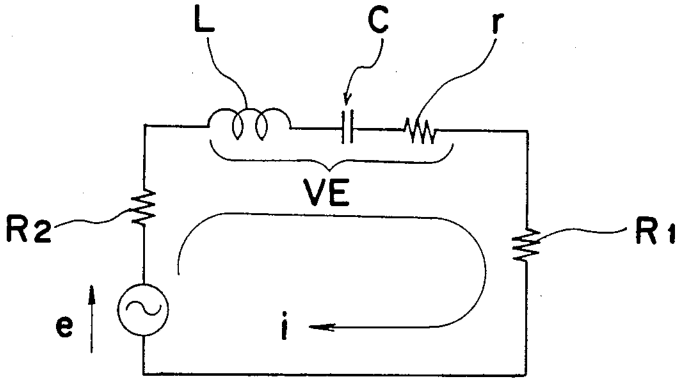
FIG. 7 shows an equivalent circuit of the high frequency filter of FIG. 6.

Now, it is assumed that the high frequency filter FE of FIG. 6 is represented by an equivalent circuit as shown in FIG. 7, in which the resonator VE is represented by a series circuit of an inductance L, static capacity C and a resistance r, while the amplifier AM is denoted by a voltage source e, an input impedance R1 and an output impedance R2.

On the supposition that the relation is R1=R2=R, and the current flowing through the circuit in FIG. 7 is represented by i, the amplification factor of the amplifier AM is denoted by A, the outer sharpness Q of the resonator VE and the amplifier AM with respect to external circuits are designated Qe, and the initial stage sharpness Q of the resonator VE is represented by Qo, the relation as follows is established.

$$e=AiR=i(2R+r) \quad (1)$$

Meanwhile, by definition, $$Qe=(\omega L)/R \quad (2)$$

$$Qo=(\omega L)/r \quad (3)$$

Accordingly, by the above equations (1), (2) and (3), the sharpness Q′o after Q is increased by the amplifying function of the amplifier AM will be represented by $$1/(Q'o)=1/(Qo)+(2-A)/(Qe) \quad (4)$$

Figure 8:
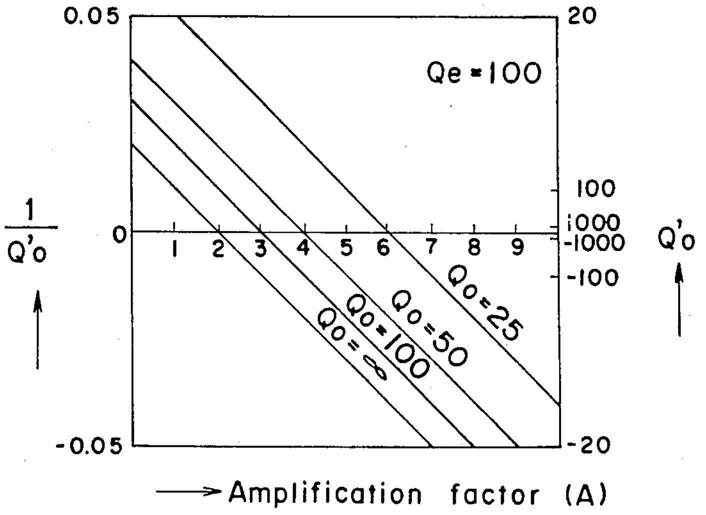
FIG. 8 is a graph showing a relation between the amplification factor and sharpness Q of the filter of FIG. 6.

In the above equation (4), on the assumption that Qe=100, and Qo=25, 50, 100 and ∞, values of 1/Q′o and Q′o with respect to the amplification factor (A) will be represented in a graphical form as in FIG. 8.

Figure 10:
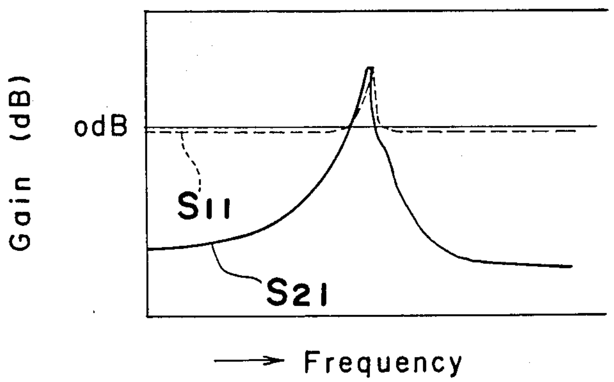
Fig. 10 PRIOR ART
FIG. 10 is a graph for explaining the passing characteristic and reflecting characteristic of a conventional high frequency filter.
Figure 11:
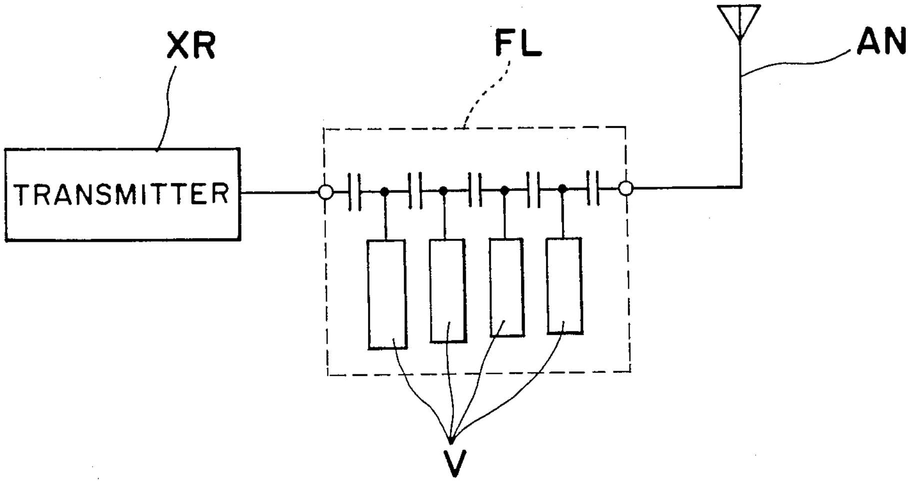
Fig. 11 PRIOR ART
FIG. 11 is a block circuit diagram showing the construction of a conventional high frequency filter (already referred to).

As in seen from FIG. 8, by combining the resonator VE with the amplifier AM as the active element, the value of 1/Q′o may be reduced down to a negative region. In other words, if the circuit of FIG. 6 is used as a band-pass filter, a high frequency band-pass filter having gain may be realized. In in the high frequency band-pass filter of FIG. 6, when the outer sharpness Qe1 as observed from the input side, and the outer sharpness Qe2 as observed from the output side are made symmetrical with respect to each other in the uter sharpness Qe of the resonator VE, i.e. when the relation is set to be Ce1=Ce2 in FIG. 6, reflection increases with respect to the passing characteristic S21 as represented by a curve S11 in FIG. 10. Therefore, the circuit connected to the front stage of the high frequency band-pass filter tends to be destroyed or distorted.

Figure 9:
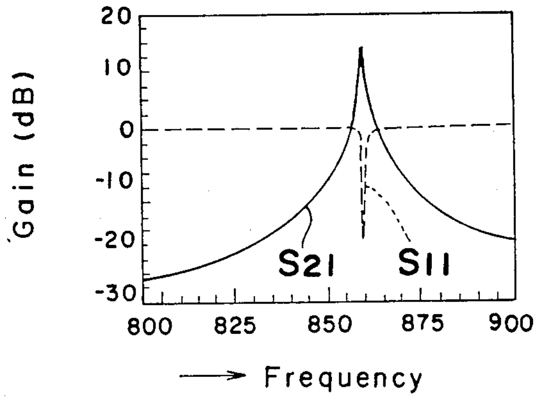
FIG. 9 is a graph showing results of measurements of the passing characteristic and reflecting characteristic of the high frequency filter of FIG. 6.

Accordingly, in the present invention, the relation is set to Ce1≠Ce2 as already mentioned for matching with respect to external circuits, in order to make the outer sharpness Qe1 as observed from the input side asymmetrical with respect to the outer sharpness Qe2 as observed from the output side. In the embodiment of FIG. 6, upon setting Ce1=0.4pF, and Ce2=1.3pF, the reflection S11 is as shown in FIG. 9 with respect to the passing characteristic S21.

As described so far, by setting the relation at Qe1≠Qe2, it is possible to realize a high frequency active filter capable of matching with respect to external circuits even while having gain.

Although the present invention has been fully described by way of example with reference to the accompanying drawings, it is to be noted here that various changes and modification will be apparent to those skilled in the art. Therefore, unless otherwise such changes and modifications depart from the scope of the present invention, they should be construed as included therein.

What is claimed is:

1. A high frequency band-pass filter which is adapted to pass high frequency signals in a predetermined frequency band, comprising:

at least a first resonator having two ends;

an input terminal and an output terminal of said band-pass filter which are coupled to said first resonator;

active element means for presenting a negative resistance when said resonator is in a resonant state in said predetermined frequency band; said active element means comprising a positive feedback loop which includes, in series, a first electrode, an amplifier, a phase adjuster, and a second electrode, wherein said two electrodes respectively define gaps with the resonator, thereby capacitively coupling the active element means to said resonator.

2. A filter as in claim 1, further comprising at least one additional resonator coupled to said first resonator.

3. A filter as in claim 2, further comprising additional said active element means capacitively coupled to said additional resonator.

4. A filter as in claim 1, further comprising a plurality of additional resonators coupled to said first resonator.

5. A filter as in claim 4, wherein the active element means is coupled to the resonator at an input stage of said band-pass filter.

6. A filter as in claim 5, further comprising additional said active element means capacitively coupled to one of said additional resonators.

7. A filter as in claim 1, wherein said input and output terminals are capacitively coupled to said first resonator.

8. A filter as in claim 2, wherein said input terminal is capacitively coupled to said first resonator; said resonators are capacitively coupled to one another; and said output terminal is capacitively coupled to one of said additional resonators.

9. A filter as in claim 4, wherein said input terminal is capacitively coupled to said first resonator; said resonators are capacitively coupled to one another; and said output terminal is capacitively coupled to one of said additional resonators.

10. A filter as in claim 1, wherein said input and output terminals are coupled to a first end of said first resonator, and said active element means is capacitively coupled to an opposite second end of said first resonator.

11. A filter as in claim 10, wherein said input and output terminals are capacitively coupled to said first end of said first resonator.

12. A filter as in claim 10, wherein said input and output terminals are conductively coupled to said first end of said first resonator.

13. A filter as in claim 1, wherein said input terminals and said output terminals are coupled to one end of said first resonator, and said active element means is capacitively coupled to the same end of said first resonator.

14. A high frequency bandpass filter comprising:

an input terminal and an output termnal;

a resonator which resonates in the passband of said filter;

active element means for presenting a negative resistance and thereby providing gain when said resonator is in a resonant state in said passband; said active element means comprising a positive feedback loop which includes, in series, a first electrode, an amplifier, a phase adjuster, and a second electrode, wherein said two electrodes respectively define gaps with said resonator, thereby capacitively coupling said active element means to said resonator;

means for matching said filter to external circuits, comprising an input capacitance which capacitively couples said resonator to said input terminal, and an output capacitance which capacitively couples said resonator to said output terminal; said input and output capacitances having unequal capacitance values;

whereby the Q of the filter as seen from the input terminal is unequal to the Q of the filter as seen from the output terminal.

15. A filter as in claim 14, wherein the input capacitance value is less than the output capacitance value.

16. A filter as in claim 15, wherein the input capacitance value is less than substantially half the output capacitance value.

17. A stripline bandpass filter comprising:

A dielectric substrate having front and back main faces, and a ground electrode on the back main face;

a comb-like-type stripline resonator on said front main face, said resonator having a first stage at one end thereof, and having at least one additional stage, each said stage comprising a strip element having an electrical length of $\lambda/4$;

said stripline resonator having a ground electrode which runs along an edge of said substrate and conductively interconnects said strip elements; each said strip element extending away from said ground electrode; said ground electrode on said front main face being conductively interconnected with said ground electrode on said back main face by a conductor which runs across said edge of said substrate; and a positive feedback loop comprising an amplifier on said substrate; and a pair of phase-adjusting strip lines connected respectively to an input and an output of said amplifier, each said phase-adjusting strip line defining a gap with a respective portion of said strip element of said first stage at an end thereof away from said ground electrode, thereby capacitively coupling said positive feedback loop to said first stage.

18. A stripline bandpass filter as in claim 17, further comprising an additional said positive feedback loop capacitively coupled to one of said additional stages.

19. A stripline bandpass filter comprising:

a dielectric substrate;

a stripline element formed on said substrate;

a pair of connector striplines formed on said substrate; each being capacitively coupled to said stripline element by a respective gap defined between said connector stripline and said stripline element; and a positive feedback loop comprising an amplifier on said substrate; and a pair of phase-adjusting striplines connected respectively to an input and an output of said amplifier, each said phase-adjusting stripline defining a gap with a respective portion of said strip element, thereby capacitively coupling said positive feedback loop to said stripline element.

20. A filter as in claim 19, wherein said stripline element has an electrical length of λ/2.

21. A filter as in claim 19, wherein said pair of connector striplines and said positive feedback loop are respectively coupled to opposite ends of said stripline element.

22. A filter as in claim 19, wherein said pair of connector striplines and said positive feedback loop are coupled to the same end of said stripline element.

23. A filter as in claim 19, wherein said stripline element has an electrical length of λ/4.

24. A stripline bandpass filter comprising:

a dielectric substrate having front and back main faces, and a back ground electrode on said back main face;

a stripline resonator formed on said front main face, said resonator comprising a strip element and a front ground electrode; said strip element having an electrical length of λ/4 and extending away from said front ground electrode; said front ground electrode running along an edge of said substrate; said front and back ground electrodes being conductively interconnected by a conductor which runs across said edge of said substrate;

a pair of connector striplines formed on said substrate; each being capacitively coupled to said stripline element by a respective gap defined between said connector stripline and said stripline element; and a positive feedback loop comprising an amplifier on said substrate; and a pair of phase-adjusting striplines connected respectively to an input and an output of said amplifier, each said phase-adjusting stripline defining a gap with a respective portion of said strip element, thereby capacitively coupling said positive feedback loop to said stripline element.

25. A filter as in claim 24, wherein said pair of connector striplines and said positive feedback loop are coupled to an end of said stripline element away from said front ground electrode.

* * * * *